United States Patent [19]

Sasaki et al.

[11] Patent Number: 4,700,127
[45] Date of Patent: Oct. 13, 1987

[54] MICROWAVE PROBE AND ROTARY BODY DETECTING APPARATUS USING THE SAME

[75] Inventors: Kunihiko Sasaki, Nukata; Masao Kodera, Okazaki; Seizi Huzino, Anjo; Takeshi Tanaka, Toyohashi, all of Japan

[73] Assignee: Nippon Soken, Inc., Nishio, Japan

[21] Appl. No.: 729,355

[22] Filed: May 1, 1985

[30] Foreign Application Priority Data

May 2, 1984 [JP] Japan .................................. 59-88848
May 11, 1984 [JP] Japan .................................. 59-95325
May 16, 1984 [JP] Japan .................................. 59-98203

[51] Int. Cl.$^4$ ...................... F03B 15/00; G01R 27/04
[52] U.S. Cl. ................................ 324/58.5 C; 73/572; 73/116; 415/14
[58] Field of Search ................... 415/14; 73/572, 116; 340/679; 324/58.5 C, 58.5 B, 58 C, 58.5 R; 333/230, 231

[56] References Cited

U.S. PATENT DOCUMENTS

| | | | |
|---|---|---|---|
| 2,548,598 | 4/1951 | Feiker | 324/58.5 C |
| 3,589,177 | 6/1971 | Merlo | 324/58.5 C |
| 3,703,825 | 11/1972 | Merlo | 324/58.5 C |
| 4,384,480 | 5/1983 | Krage et al. | |
| 4,384,819 | 5/1983 | Baker | 324/58.5 B |
| 4,403,504 | 9/1983 | Krage | 324/58.5 B |
| 4,437,338 | 3/1984 | Wilson | 324/58.5 B |

Primary Examiner—Reinhard J. Eisenzopf
Assistant Examiner—Jose M. Solis
Attorney, Agent, or Firm—Cushman, Darby & Cushman

[57] ABSTRACT

A microwave probe has a cylindrical support made of stabilized zirconia being excellent in heat insulation, and the cylindrical support is threadably installed at a partitioning wall to partition an atmosphere of high temperature. The support is provided at the center with a through hole, and an antenna for transmitting or receiving microwave is installed at one opening of the through hole positioning at outside of the partitioning wall, and a metal ring member is installed at other opening of the through hole positioning within the partitioning wall. The transmitting and receiving antenna and the ring member are fixed to respective openings by a ceramic adhesive which is filled in the through hole and excellent in heat insulation. A part of the ring member projects in the atmosphere. A rotary body breakage detecting apparatus has the microwave probe installed at a cabinet wall to cover a wing body rotating in an atmosphere of high temperature, and a microwave oscillator and a microwave detector are connected to the probe through a circulator. A breakage detecting circuit is connected to the microwave detector. The breakage detecting circuit detects that peak value of the receiving signal outputted from the detector (the signal pulsating with rotation of the wing body) varies beyond a prescribed range, and generates signal informing the breakage of the wing body.

7 Claims, 11 Drawing Figures

MICROWAVE PROBE AND ROTARY BODY DETECTING APPARATUS USING THE SAME

BACKGROUND OF THE INVENTION

1. Field of the Invention

The present invention relates to a microwave probe having a thermal insulating structure and a detecting apparatus to detect breakage of a rotarybody in an atmospher of high temperature using the probe.

2. Description of the Prior Art

In recent years, microwave circuits can be constituted using a quite compact IC structure by development of a solid state circuit element, a microstrip and the like. With this devlopement, application of microwave has been tried in various measuring fields other than communication. In U.S. Pat. No. 4,384,480 for example, method and apparatus are disclosed where microwave is transmitted into a combustion chamber of an engine and top dead center position of a piston is determined from the received waveform.

For such purpose, a microwave probe must be installed on a wall of a combustion chamber rising to a high temperature beyond 1000° C. In a probe structure of the prior art, the heat from this combustion chamber may be conducted to a coaxial cable or a circuit device connected to the probe, and therefore the deterioration of such connected device is apt to occur. On the other hand, in order to detect breakage of a rotary body rotating at high speed in an atmosphere of high temperature, such as a turbine, an apparatus to detect abnormal vibration or abnormal sound in a rotary shaft has been proposed in the prior art. In this apparatus, however, the broken portion cannot be specified securely and reliability of the detection is not very high.

SUMMARY OF THE INVENTION

An object of the invention is to provide a microwave probe which can detect behavior of a body in an atmosphere of high temperature.

Another object of the invention is to provide a microwave probe which is installed at a partitioning wall to partition an atmosphere of high temperature and excellent in heat insulation.

A further object of the invention is to provide a rotary body breakage detecting apparatus which can securely detect breakage of a rotary body rotating in an atmosphere of high temperature.

Still another object of the invention is to provide a rotary body breakage detecting apparatus which can securely detect breakage of a rotary body using the microwave probe.

A microwave probe of the invention comprises a support fixed to a partitioning wall for partitioning an atmosphere of high temperature, and the support is made of heat insulating material. The support is provided at one end outside the partitioning wall with an antenna for transmitting or receiving microwave, and at other end exposing in the atmosphere with a conductive ring, member projecting partly in the atmosphere.

According to a microwave probe of above-mentioned structure, microwave is transmitted or received in an atmosphere of high temperature at favorable condition, and at the same time the heat transmission to the antenna is prevented effectively.

In a rotary body breakage detecting apparatus of the invention, the microwave probe is installed at a wall of a cabinet to cover a rotary body to be detected in an atmosphere of high temperature, microwave is transmitted or received from the probe into the cabinet, and if level of receiving signal obtained corresponding to intensity of receiving microwave varies beyond a prescribed level, breakage detecting means generates breakage signal of the rotary body.

According to a breakage detecting apparatus of above-mentioned structure, breakage of a rotary body can be securely detected.

BRIEF DESCRIPTION OF THE DRAWINGS

FIG. 3 is a diagram of whole constitution of a rotary body breakage detecting apparatus;

FIG. 4 is a circuit diagram of a breakage detecting circuit;

FIG. 5 is a waveform chart of signals;

FIG. 7 is a diagram of whole constitution of a rotary body breakage detecting apparatus;

FIG. 8 is a circuit diagram of a breakage detecting circuit;

FIG. 9 is a waveform chart of signals;

FIG. 10 is a circuit diagram of a breakage detecting circuit; and

FIG. 11 is a waveform chart of signals.

DESCRIPTION OF THE PREFERRED EMBODIMENTS

Figure 1:
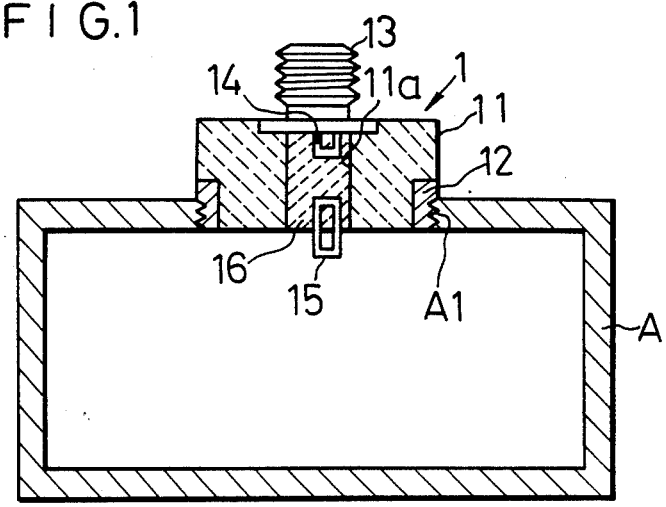
FIG. 1 is a sectional view of whole structure of a microwave probe installed at a partitioning wall as a first embodiment of the invention.

FIG. 1 shows a first embodiment of the invention. In the figure, symbol A designates a partitioning wall to seal an atmoshere of high temperature, for example, a cylinder wall of an engine or a case wall of a turbine, which is at a high temperature from the atmosphere. The partitioning wall A is provided with a through hole A1, and a threaded portion is formed on an inner circumferential surface of the through hole A1. A microwave probe 1 according to the invention is fixed to the through hole A1.

The probe 1 has a cylindrical support 11 which is threadably installed to the through hole A1 by a metal thread ring 12 fitted to the outer circumference of the support 11. The support 11 is made of a material having heat insulating and electric insulating property, such as stabilized zirconia or fire brick. The support 11 has a through hole 11a formed at the center, and an SAM type coaxial plug 13 having known structure is installed on the upper opening of the through hole 11a. An inner conductor projects from the lower surface of the coaxial plug 13, and the top end of the inner conductor is bent and short circuited towards an outer conductor in order to form a loop antenna 14. The coaxial plug 13 is connected through a coaxial cable to a microwave oscillator or a microwave detector.

A ring member 15 formed of metal conductor is spaced from the loop antenna 14 and installed at the lower opening of the through hole 11a, and the ring member 15 and the coaxial plug 13 are fixed by a ceramic adhesive 16 ("Sumiceram" of Sumitomo Chemical Co., Ltd. in the embodiment) which is injected in the through hole 11a and has excellent heat insulation properties. In this state, the lower half of the ring member 15 projects in the atmosphere.

In the probe 1 of above-mentioned structure, microwave transmitted from the loop antenna 14 is effectively electromagnetically coupled to the ring member 15 and then emitted with little attenuation from the lower half of the ring member 15 into the atmosphere of high temperature.

Microwave projected in the atmosphere of high temperature is caught by the ring member 15 and received by the antenna 14 spaced from the ring member 15. Heat transmission from the atmosphere of high temperature to the coaxial plug 13 is effectively inhibited since the loop antenna 14 and the ring member 15 are spaced from each other in the heat insulating adhesive 16. Also, heat transmission from the partitioning wall A of high temperature to the coaxial plug 13 is effectively inhibited by the support 11 of heat insulating material. Consequently, deterioratio of the coaxial cable or the like to be connected to the coaxial plug 13 prevented.

Figure 2:
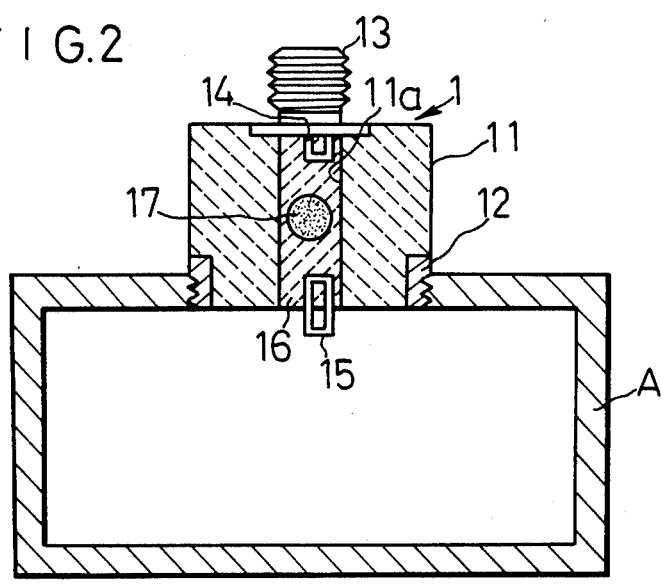
FIG. 2 is a sectional view of whole structure of a microwave probe installed at a partitioning wall as a second embodiment of the invention.

FIG. 2 shows a second embodiment of the invention. In the figure, a dielectric resonator 17 as a microwave relaying means is installed at a prescribed position between a loop antenna 14 and a ring member 15. Microwave is transmitted or received through the resonator 17, and thereby a distance between the antenna 14 and the ring member 15 may be increased with little attenuation of microwave and therefore the heat transmission can be effectively inhibited.

In place of the resonator 17, another ring member having the same constitution as that of the ring member 15 may be used.

If the antenna 14, the ring member 15 and the resonator 17 are embedded directly into the support 11 in the above embodiments, the adhesive 16 is not necessary. Although the antenna 14 need not be a loop antenna, microwave can be effectively transmitted or received in this constitution of loop antenna.

Following embodiments disclose rotary body breakage detecting apparatuses using a microwave probe in the above embodiments already described.

Figure 3:
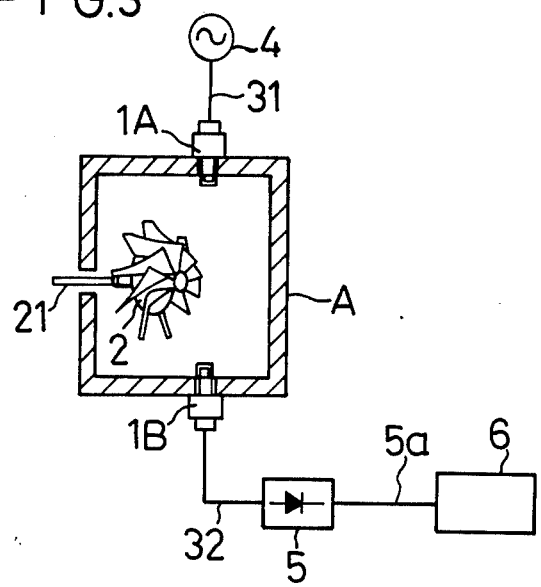
FIG. 3 through FIG. 5 show a third embodiment of the invention.

FIG. 3 shows a third embodiment of the invention. In the figure, a wing body 2, e.g. a turbine fan, is fixed to the top end of a rotary shaft 21 and rotated as a rotary body. The wing body is covered by a metal cabinet A as partitioning wall. The cabinet A is provided with microwave probes 1A, 1B on opposite side walls. The probe 1A is connected through a coaxial cable 31 to a microwave oscillator 4. On the other hand, the probe 1B is connected through a coaxial cable 32 to a microwave detector 5, and the receiving signal 5a generated from the detector 5 is inputted to a breakage detecting circuit 6. Microwave transmitted at a definite frequency from the probe 1A into the cabinet A is resonated in the cabinet A as a resonance cvity and then comes to the probe 1B.

Figure 4:
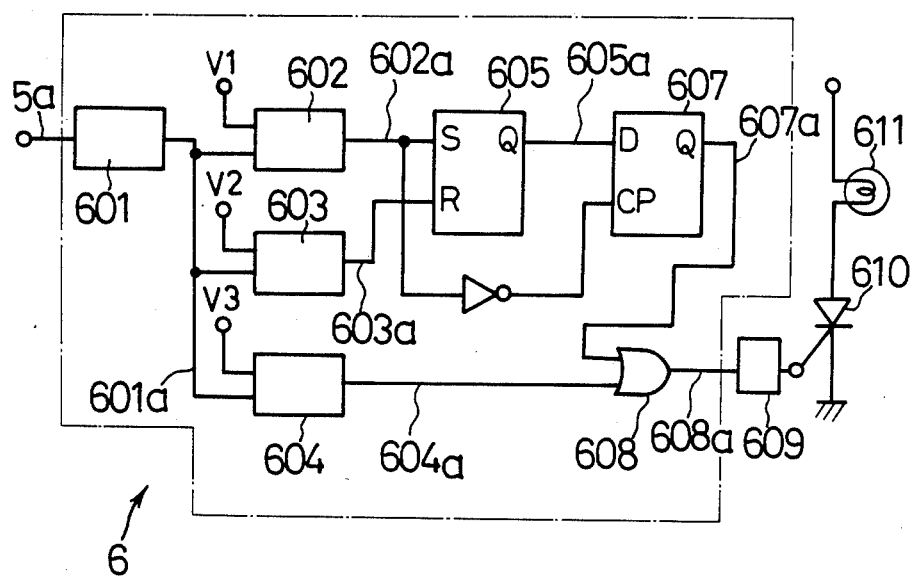

FIG. 4 shows a circuit diagram of the detecting circuit 6. In the figure, an a.c. amplifier 601 amplifies the receiving signal 5a of the detector 5 (FIG. 3) and outputs amplified signal 601a. Comparators 602, 603, 604 compare the amplified output 601a with constant voltages V1, V2, V3 respectively. If the former is greater than the latter, the comparators 602, 603 604 generate output signals 602a, 603a, 604a at "H" level respectively. Numeral 605 designates an RS flip-flop, numberal 607 a D-type flip-flop, numeral 609 a current amplifier, numeral 610 a thyristor, and numeral 611 a warning lamp.

Operation of an apparatus having the above-mentioned constitution will now be described referring to FIG. 5.

Microwave transmitted from the microwave probe 1A is resonated in the cabinet A. Since a space formed within the cabinet A varies with rotation of the wing body 2, the resonance intensity varies periodically. Consequently, the amplification signal obtained by amplifying the receiving signal 5a pulsates periodically as shown in FIG. 5(1). The figure illustrates that the wing body 2 of four wings is detected, and symbols 1, 1', 1'', 2, 3, 3', 4, 4' on the upper side of the signal waveform represent that pulsating parts correspond tot he first through fourth wings. In the case of four wings, the same space if formed four times per one revolution of the rotary shaft 21, thereby the same waveform is repeated at a prescribed period. As seen from the figure, voltage V1 is set to a value so that if the signal 601a pulsates, it necessarily goes across the voltage level. On the other hand, voltages V2, V3 are set so that if there is no breakage in the wing body 2, the peak value of the pulsation is always positioned between both voltage levels (at 1, 2, 3, 4 in FIG. 5(1)).

Figure 5:
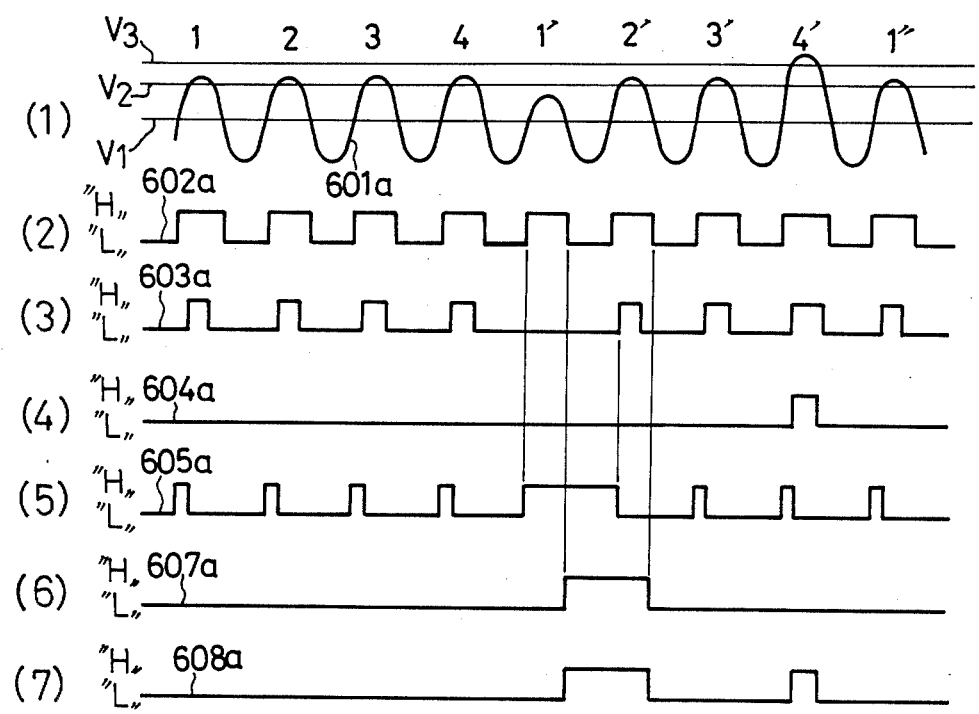

If there is no breakage in the wing body 2, signal 602a (FIG. 5(2)) and signal 603a (FIG. 5(3)) are outputted in pulse form corresponding to the pulsation of signal 601a, but signal 604a (FIG. 5(4)) is not outputted.

On the contrary, if a part of the wing body 2 is broken, a space formed within the cabinet A is no longer a repetition of the same space, but a peak value of pulsation of the signal 601a varies during one revolution of the rotary shaft 21 (at 1', 2', 3', 4' in FIG. 5(1)). Consequently, the peak value of the signal 601a becomes lower than voltage V2 (at 1' in FIG. 5(1)) or higher than voltage V3 (at 4' in FIG. 5(1)). In the former case, the signal 603a is not outputted, thereby output signal 605a (FIG. 5(5)) of the flip-flop 605 is inputted to the flip-flop 607, which is set to generate output signal 607a (FIG. 5(6)). The signal 607a is inputted to the OR gate 608. On the contrary, in the latter case, output signal 604a (FIG. 5(4)) is generated from the comparator 604 is also inputted to the OR gate 608.

Output signal 608a (FIG. 5(7)) of the OR gate 608 is inputted to the current amplifier 609, and the warning lamp 611 is lit by the thyristor 610.

Figure 6:
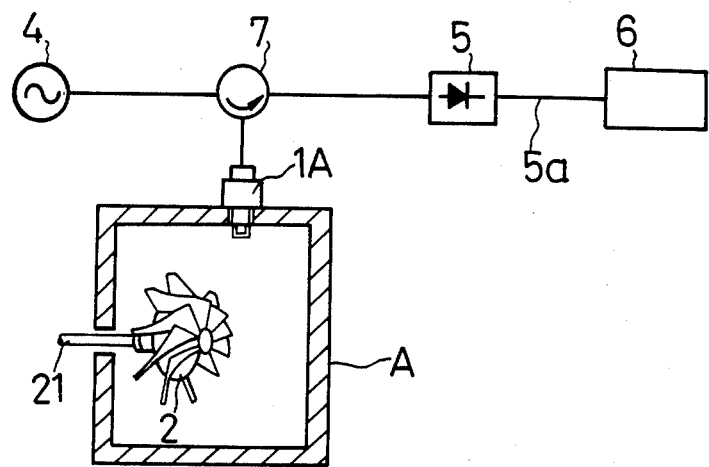
FIG. 6 is a diagram of whole consitution of a rotary body breakage detecting apparatus as a fourth embodiment of the invention.

The microwave probe 1A in the embodiment may be used both for transmitting and receiving, thereby the probe 1B may be omitted. This constitution is shown as a fourth embodiment of the invention in FIG. 6. In the figure, the probe 1A is connected through a circulator 7 to a microwave oscillator 4 and a microwave detector 5. Microwave generated from the oscillator 4 is transmitted by the circulator 7 to the probe 1A and emitted into the cabinet A, and microwave received by the probe 1A is transmitted by the circulator 7 to the detector 5.

Figure 7:
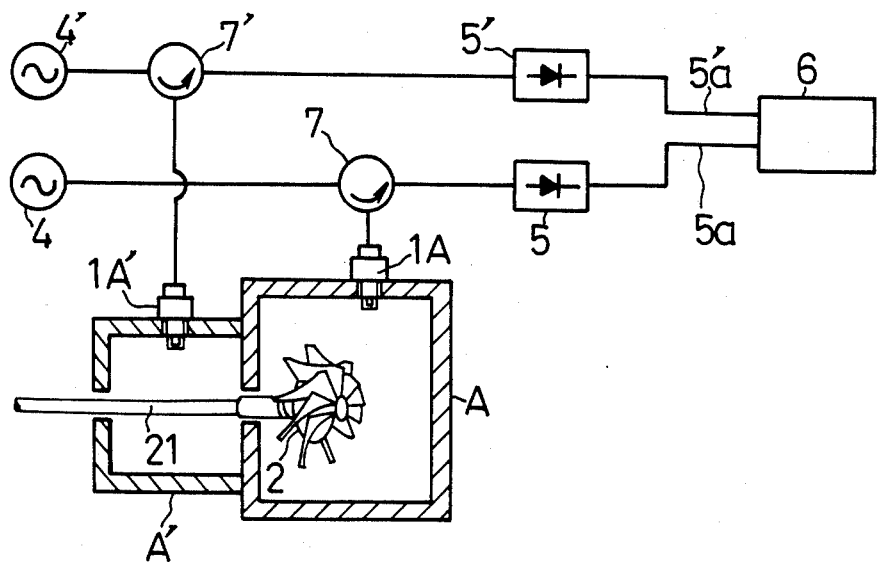
FIG. 7 through FIG. 9 show a fifth embodiment of the invention.

FIG. 7 shows a fifth embodiment of the invention, and a breakage detecting apparatus in the embodiment detects breakage of a rotary shaft 21 in addition to breakage of the wing body 2. In FIG. 7, a metal cabinet A' is installed to cover the rotary shaft 21 thereby a microwave resonance cavity is constituted. The cabinet A' is provided with a probe 1A' for transmitting and receiving microwave, and the probe 1A' is connected through a circulator 7' to the microwave oscillator 4' and the microwave detector 5'. Receiving signal 5'a generated from the detector 5' is inputted to a breakage detecting circuit 6.

Figure 8:
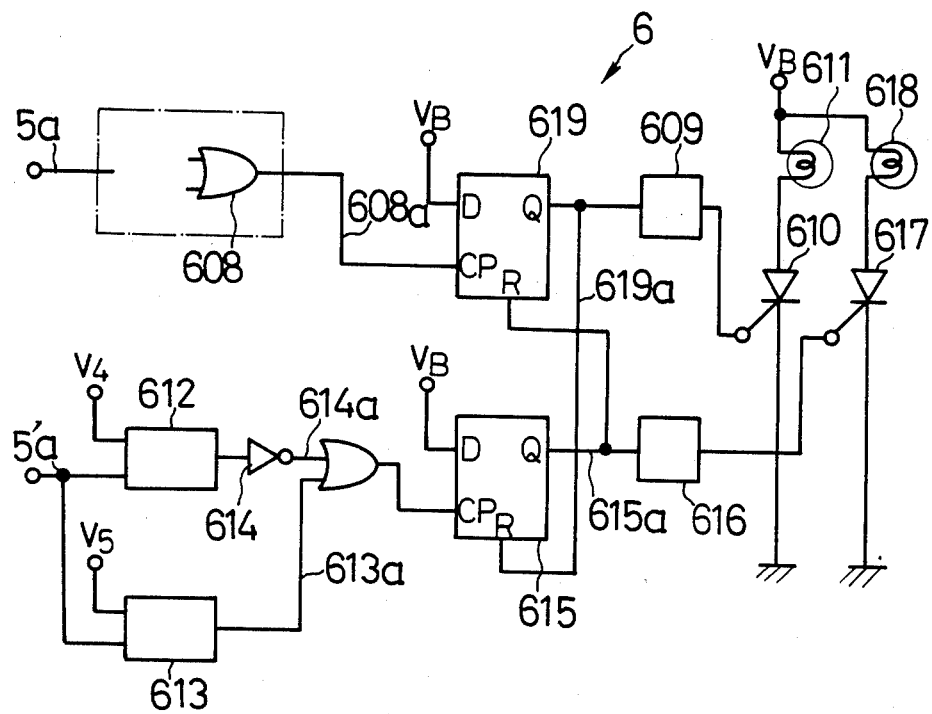

FIG. 8 shows a circuit diagram of the detecting circuit 6. In the figure, comparators 612, 613 compare the receiving signal 5'a with constant voltages V4, V5 respectively. If the former is greater than the latter, the comparators 612, 613 generate an output signal at an "H" level. Numerals 615, 619 designate D-type flip-flops, numeral 616 a current amplifier, numeral 617 a thyristor, and numeral 618 a warning lamp. A circuit enclosed by dash-and-dot line in FIG. 8 is the same as that of the third embodiment enclosed by dash-and-dot line in FIG. 4.

If the wing body 2 is broken, the flip-flop 619 is set by signal 608a and the warngin lamp 611 is lit through the thyristor 610. Then the flip-flop 615 is reset by the output signal 619a of the flip-flop 619.

Figure 9:
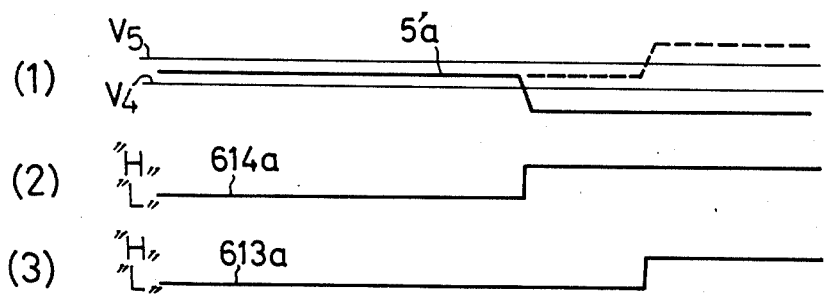

When the rotary shaft 21 is in the normal state, the receiving signal 5'a is at a constant level between voltages V4, V5 (at left hafl in FIG. 9(1)), and signal 614a (FIG. 9(2)) resulting from output signal of the comparator 612 inverted by the inverter 614 and output signal 613a (FIG. 9(3)) of the comparator 613 are at "L" level. If the rotary shaft 21 is broken, the receiving signal 5'a becomes lower than voltage V4 (solid line at right half in FIG. 9(1)) or higher than this (broken line at right half in FIG. 9(1)), thereby the signal 614a or the signal 613a becomes "H" level. Consequently, the flip-flop 615 is set, and the warning lamp 618 is lit through the current amplifier 616 and the thyristor 617. Then the flip-flop 619 is reset by output signal 615a of the flip-flop 615. Thus, breakage of the wing body 2 and breakage of the rotary shaft 21 can be discriminated distinctly.

Figure 10:
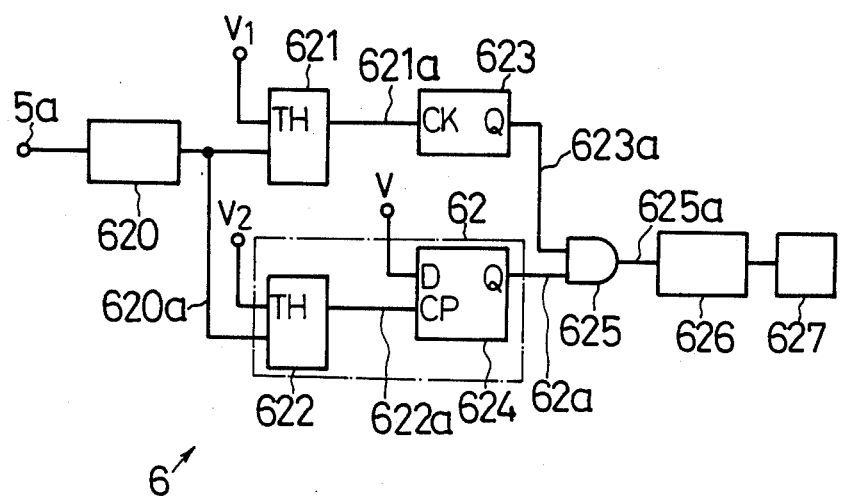
FIG. 10 and FIG. 11 show a sixth embodiment of the invention.

FIG. 10 shows a circuit diagram of a breakage detecting circuit 6 in a sixth embodiment of the invention. Using the detecting circuit 6 of the embodiment, breakage of the wing body 2 and breakage of the rotary shaft 21 can be discriminated distinctly even by apparatus constitution in FIG. 6. In FIG. 10, an a.c. amplifier 620 amplifies receiving signal 5a of the detector 5 (FIG. 6) and outputs amplification signal 620a. Comparators 621, 622 compare the amplification signal 620a with constant voltages V1, V2. If the former is greater than the latter, the comparators 621, 622 generate output signals 621a, 622a at "H" level respectively. A counter 623 outputs count-up pules 623a at every pulse input of the prescribed number (specified to 5 being equal to the wing number of the wing body 2 in this embodiment). Numeral 624 designates a D-type flip-flop, and D-terminal of the flip-flop 624 is connected to powe source V at "H" level. A counter 626 counts input pulse 625a and generates count output, and an indicator 627 indicates the count output. The comparator 622 and the flip-flop 624 constitute an initial breakage detecting circuit 62.

Operation of a breakage detecting circuit in above-mentioned constitution will now be described referring of FIG. 11.

Figure 11:
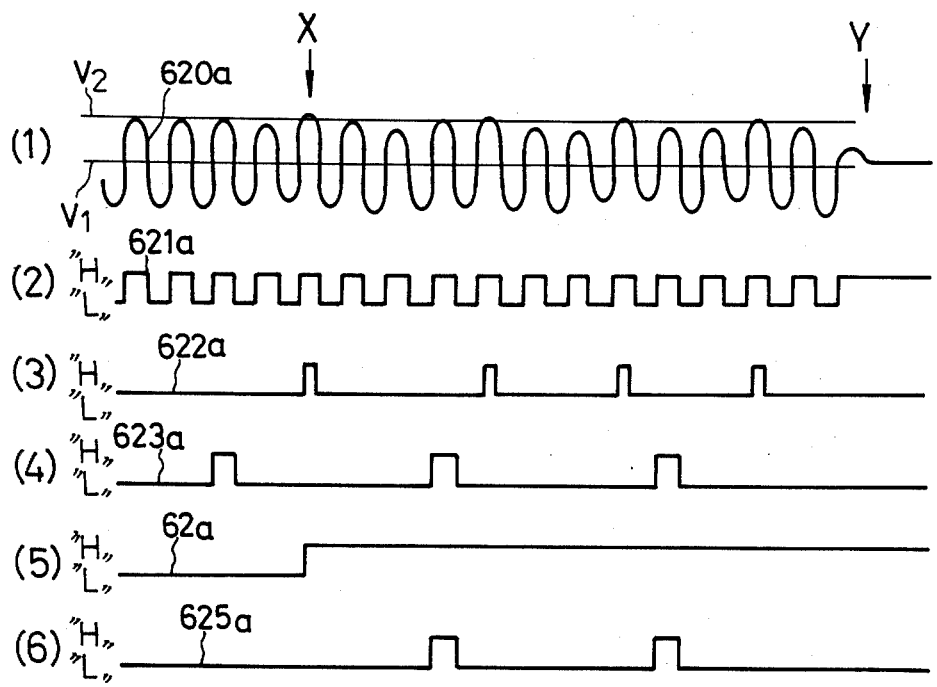

Amplification signal 620a by amplifying the receiving signal 5a pulsates periodically with rotation of the wing body 2 as shown in FIG. 11(1). Voltage V1 is set to value so that if the signal 620a pulsates it necessarily comes across the voltage level. Voltage V2 is set to value so that if there is no breakage in the wing body 2 or the rotary shaft 21, peak vlaue of the pulsation does not exceed the voltage level. Consequently, the comparator 621 outputs pulse signal 621a (FIG. 11(2)) at every pulsation of the signal 620a. The counter 623 outputs pulse signal 623a (FIG. 11(4)) at every input of the signal 621a of five pulses, that is, at every one revolution of the rotary shaft 21.

If the wing body 2 or the rotary shaft 21 begins to be broken, a space formed with in the cabinet A becomes no more repetition of the same space, but the resonance intensity of microwave varies thereby peak value of the signal 620a exceeds voltage V2 (at point X in FIG. 11(1)). Thereby pulse signal 622a (FIG. 11(3)) is outputted from the comparator 622 and output signal 62a (FIG. 11(5)) of the flip-flop 624 is set to "H" level. The signal 62a as initial breakage signal opens the AND gate 625, and the signal 623a is inputted as signal 625a (FIG. 11(6)) to the counter 626 and counted. The count value is indicated in the indicator 627.

If the wing body 2 or the rotary shaft 21 is broken completely, the rotation is stopped and therefore pulsation of the signal 620a is stopped (at point Y in FIG. 11(1)). Consequently, the signal 623a is no more outputted, and the counter 626 stores the rotation number from starting of breakage of the wing body 2 to the complete breakage.

According to an experiment of the inventors, the rotation number from starting of breakage to the complete breakage is clearly different at breakage of the wing body 2 and at breakage of the rotary shaft 21. The rotation number is 1-2 in the former and several tens in the latter. Consequently, whether the broken part is at the wing body 2 or at the rotary shaft 21 can be securely discriminated from the count number of the counter 626 indicated on the indicator 627.

Although the pulsating number of receiving signal is represented in terms of the rotation number in the above embodiment, the pulsating number may be directly indicated in integration.

The voltage V2 may be set to a value so that the amplification signal 620a does not become lower than the voltage V2 at normal state.

As above described, a microwave probe of the invention has a constitution where an antenna for transmitting or receiving microwave and a conductive ring member to be coupled electromagnetically thereto are spaced from each other and held at one end and other end of a support made of heat insulating material. In this constitution, microwave can be transmitted or received in favorable condition and at the same time the heat transmission to the antenna can be effectively inhibited.

A rotary body breakage detecting apparatus of the invention has constitution where the microwave probe is installed at a cabinet wall formed to cover a rotary body, microwave is transitted in the cabinet and resonated within the cabinet and then received, and if the receiving intensity comes beyond a prescribed region the breakage of the rotary body can be knwon. In this constitution, breakage of a wing body or the like rotating in connection to the rotary shaft can be directly detected and the broken position can be determined distinctly.

What is claimed is:

1. A rotary breakage detecting apparatus comprising: cabinet means for covering a rotarybody to be detected to partition an atmosphere of high temperature around the rotary body and and to form a microwave resonance cavity, said cabinet means including at least one wall;

microwave probe means for emitting microwave into said cabinet means and for receiving microwave resonated within said cabinet means to generate a receiving signal corresponding to an intensity of the received microwave; and breakage detecting means for detecting a breakage of the rotary body from a variation of a level of the receiving signal beyond a prescribed level and generating a breakage signal;

said microwave probe comprising:

(a) a support fixed to said wall of said cabinet means, one end of said support positioned at an outside of said cabinet wall and the other end thereof exposed in said atmosphere of high temperature;

(b) antenna means, installed at said one end of said support, for transmitting receiving microwave to said other end; and (c) a conductive ring member installed at said other end of said support and spaced from said antenna means by a prescribed distance, a part of said ring member projecting from said other end of said support into the atmosphere;

wherein said rotary body is a wing body supported by a shaft and rotating wherein said breakage detecting means detects a peak value of the receiving signal pulsating periodically with rotation of the wing body which peridically varied in amplitude, an amplitude beyond a prescribed level generating the breakage signal.

2. A rotary body breakage detecting apparatus as set forth in claim 1, wherein said breakage detecting means has a reference level beyond which the receiving signal occurs periodically with the pulsation and a detecting level beyond which the receiving signal occurs periodically only during a non-breakage state of the wing body, and said breakage detecting means comprises a flip-flop which is set if the receiving signal has an amplitude beyond the reference level and reset if the receiving signal has an amplitude beyond the detecting level, whereby the breakage signal is generated when an output of said flip-flop continues for at least a prescribed time or more.

3. A rotary body breakage detecting apparatus as set forth in claim 1, wherein said breakage detecting means comprises initial breakage detecting means for detecting that a peak value of the receiving signal pulsating preiodically with rotation of the wing body has an amplitude beyond a prescribed level and generating an initial breakage signal, and integrating means for integrating the pulsation number from inputting of the initial breakage signal to stopping of the pulsation of the receiving signal, whereby the breakage portion is at the wing body or at the shaft can be discriminted from the integrating value of said integrating means.

4. A rotary breakage detecting apparatus comprising:

cabinet means for covering a rotary body to be detected to partition an atmosphere of high temperature around the rotary body and and to form a microwave resonance cavity, said cabinet means including at least one wall;

microwave probe means for emitting microwave into said cabinet means and for receiving microwave resonated within said cabinet means to generate a receiving signal corresponding to an intensity of the received microwave; and breakage detecting means for detecting a breakage of the rotary body from a variation of a level of the receiving signal beyond a prescribed level and generating a breakage signl;

said microwave proble comprising:

(a) a support fixed to said wall of said cabinet means, one end of said support positioned at an outside of said cabinet wall and the other end thereof exposed in said atmosphere high temperature;

(b) antenna means, installed at said one end of said support, for transmitting receiving microwave to said other end; and (c) a conductive ring member installed at said other end of said support and spaced from said antenna means by a prescribed distance, a part of said ring member projecting from said other end of said support into the atmosphere wherein said rotary body is a wing body supported by a shaft and rotating; and wherein said breakage detecting means comprises intitial breakage detecting means for detecting that a peak value of the receiving signal pulsating periodically with rotation of the wing body has an amplitude beyond a prescribed level and generating an initial breakage signal, and integrating means for integrating the pulsation number from inputting of the initial breakge signal to stopping of the pulsation of the receiving signal, whereby whether the breakage portion is at the wing body or at the shaft can be discriminated from the integrating value of said integrating means.

5. A rotary body breakage detecting apparatus as set forth in claim 4, wherein said breakage detecting means has a reference level beyond which the receiving signal pulsates periodically and a detecting level which the receiving signal exceeds when one of the wing body and the shaft is broken, and said breakage detecting means comprises a flip-flop being set when the receiving signal comes beyond the detecting level and generating the initial breakage signal, and counter means for counting every state that the receiving signal comes beyond the reference level when the initital breakage signal is inputted.

6. The microwave probe for use in a high temperature atmosphere on one side of a partitioning wall, compising:

a support adapted to be fixed to the partitioning wall formed of heat insulating material, one end of said support positioned at an outside of the partitioning wall and another end thereof of said support exposed in said atmosphere on said one side of the partitioning wall;

an antenna installed at said one end of said support for at least one of transmitting and receiving microwave to said another end of said support;

a conductive ring member installed at said another end of said support and spaced from said antenna, a part of said ring member projecting from said other end of said support into the atmosphere;

microwave relaying means installed in said support between said antenna and said conductive ring member and spaced from said antenna and said ring member by a prescribed distance;

wherein said microwave relaying means is another conducive ring member having the same constitution as that of said conductive ring member.

7. A microwave probe for use in a high temperature atmosphere on one side of a partitioning wall, comprising:

a support adapted to be fixed to the partitioning wall formed of heat insulating material, one end of said support positioned at an outside of the partitioning wall and another end of said support exposed in said atmosphere on said one side of the partitioning wall;

an antenna installed at said one end of said support for at least one of transmitting and receiving microwave to said another end of said support; and a conductive ring member installed at said another end of said support and spaced from said antenna, a part of said ring member projecting from said other end of said support into the atmosphere;

microwave relaying means installed in said support between said antenna and said conductive ring member and spaced from the antenna and the ring member by a prescribed distance;

wherein said microwave relaying means is a dielectric resonator.

* * * * *